United States Patent
Nguyen et al.

[19]

[11] Patent Number: 5,913,144
[45] Date of Patent: Jun. 15, 1999

[54] OXIDIZED DIFFUSION BARRIER SURFACE FOR THE ADHERENCE OF COPPER AND METHOD FOR SAME

[75] Inventors: Tue Nguyen; Lawrence J. Charneski, both of Vancouver; Lynn R. Allen, Camas, all of Wash.

[73] Assignees: Sharp Microelectronics Technology, Inc., Camas, Wash.; Sharp Kabushiki Kaisha, Osaka, Japan

[21] Appl. No.: 08/717,267

[22] Filed: Sep. 20, 1996

[51] Int. Cl.$^6$ ................... H01L 21/3065; H01L 21/310
[52] U.S. Cl. .................... 438/643; 438/648; 438/653; 438/658; 438/677; 438/687
[58] Field of Search ..................... 438/643, 644, 438/648, 653, 658, 677, 687, 680

[56] References Cited

U.S. PATENT DOCUMENTS

| | | | |
|---|---|---|---|
| 5,130,274 | 7/1992 | Harper et al. ........................ | 438/624 |
| 5,236,869 | 8/1993 | Takagi et al. ........................ | 438/635 |
| 5,240,879 | 8/1993 | De Bruin ............................. | 437/190 |
| 5,429,987 | 7/1995 | Allen ................................. | 437/187 |
| 5,605,724 | 2/1997 | Hong et al. ......................... | 427/535 |
| 5,624,874 | 4/1997 | Lim et al. ........................... | 438/653 |
| 5,670,421 | 9/1997 | Nishitani et al. .................... | 438/641 |

OTHER PUBLICATIONS

Article entitled "Chemical Mechanical Polishing of Copper Metallized Multilevel Interconnect Devices" presented at the 1995 Proceedings—12$^{th}$ International VLSI Multilevel Interconnection Conference (VMIC), Jun. 27–29, 1995, Santa Clara, CA, Catalog No. 95ISMIC –104 –pp. 505–507. (Wang et al.).

Article entitled "Copper Interconnection with Tungsten Cladding for ULSI" presented at the 1991 Symposium on VLSI Technology, Digest of Technical Papers, May 28–30, 1991, pp. 37–40. (Cho et al.).

Article entitled Encapsulated Copper Interconnection Devices Using Sidewall Barriers, presented at the 1991 VMIC Conference, Jun. 11–12, 1991, pp. 99–108. (Gardner et al.).

*Primary Examiner*—Richard A Booth
*Assistant Examiner*—Ha Tran Nguyen
*Attorney, Agent, or Firm*—Gerald Maliszewski; David C. Ripma

[57] ABSTRACT

A method has been provided for improving the adhesion of Cu to a diffusion barrier material, such as TiN, in an integrated circuit substrate. The diffusion barrier is exposed to either a reactive oxygen species, or a plasma containing oxygen. A thin layer of the diffusion barrier is oxidized, typically less than 50 Å, in response to exposure to the oxygen environment. CVD copper is then deposited over the oxidized diffusion barrier surface. The oxide layer improves bonding between the copper and diffusion barrier surfaces. The oxide layer permits the control of tolerances in the diffusion barrier preparation processes, and copper precursor, to be relaxed. An integrated circuit comprising an oxide layer between the diffusion barrier and the copper layer is also provided.

10 Claims, 2 Drawing Sheets

OXIDIZED DIFFUSION BARRIER SURFACE FOR THE ADHERENCE OF COPPER AND METHOD FOR SAME

BACKGROUND AND SUMMARY OF THE INVENTION

This invention relates generally to integrated circuit processes and fabrication, and more particularly, to a system and method of adhering copper to a diffusion barrier surface.

The demand for progressively smaller, less expensive, and more powerful electronic products, in turn, fuels the need for smaller geometry integrated circuits (ICs), and large substrates. It also creates a demand for a denser packaging of circuits onto IC substrates. The desire for smaller geometry IC circuits requires that the interconnections between components and dielectric layers be as small as possible. Therefore, research continues into reducing the width of via interconnects and connecting lines. The conductivity of the interconnects is reduced as the surface area of the interconnect is reduced, and the resulting increase in interconnect resistivity has become an obstacle in IC design. Conductors having high resistivity create conduction paths with high impedance and large propagation delays. These problems result in unreliable signal timing, unreliable voltage levels, and lengthy signal delays between components in the IC. Propagation discontinuities also result from intersecting conduction surfaces that are poorly connected, or from the joining of conductors having highly different resistivity characteristics.

There is a need for interconnects and vias to have both low resistivity, and the ability to withstand volatile process environments. Aluminum and tungsten metals are often used in the production of integrated circuits for making interconnections or vias between electrically active areas. These metals are popular because they are easy to use in a production environment, unlike copper which requires special handling.

Copper is a natural choice to replace aluminum in the effort to reduce the size of lines and vias in an electrical circuit. The conductivity of copper is approximately twice that of aluminum and over three times that of tungsten. As a result, the same current can be carried through a copper line having half the width of an aluminum line.

The electromigration characteristics of copper are also much superior to those of aluminum. Copper is approximately ten times better than aluminum with respect to electromigration. As a result, a copper line, even one having a much smaller cross-section than an aluminum line, is better able to maintain electrical integrity.

There have been problems associated with the use of copper, however, in IC processing. Copper pollutes many of the materials used in IC processes and, therefore, care must be taken to keep copper from migrating. The migration of copper into silicon semiconductor regions is especially harmful. The conduction characteristics of the semiconductor regions are a consideration in the design of a transistors. Typically, the fabrication process is carefully controlled to produce semiconductor regions in accordance with the design. Elements of copper migrating into these semiconductor regions can dramatically alter the conduction characteristics of associated transistors.

Various means have been suggested to deal with the problem of copper diffusion into integrated circuit material. Several materials, especially metallic ones, have been suggested for use as barriers to prevent the copper diffusion process. For example, Cho et al., in the article entitled "Copper Interconnection with Tungsten Cladding for ULSI," 1991 Symposium on VLSI Technology, pg. 39, suggests the use of tungsten as a diffusion barrier. Molybdenum and titanium nitride (TiN) have also been suggested for use as copper diffusion barriers. Gardner, et al., in an article entitled "Encapsulated Copper Interconnection Devices Using Sidewall Barriers," in 1991 VMIC Conference, pg. 99, suggests the use of sidewall structures to completely encapsulate the copper. However, the adhesion of copper to these diffusion barrier materials has been, and continues to be, an IC process problem.

Copper cannot be deposited onto substrates using the conventional processes for the deposition of aluminum when the geometries of the selected IC features are small. That is, new deposition processes have been developed for use with copper in the lines and interconnects of an IC interlevel dielectric. It is impractical to sputter metal, either aluminum or copper, to fill small diameter vias, since the gap filling capability is poor. To deposit copper, a chemical vapor deposition (CVD) technique has been developed in the industry.

In a typical CVD process, copper is combined with a ligand, or organic compound, to make the copper volatile. That is, copper becomes an element in a compound that is vaporized into a gas. Selected surfaces of an integrated circuit, such as diffusion barrier material, are exposed to the copper gas in an elevated temperature environment. When the copper gas compound decomposes, copper is left behind on the selected surface. Several copper gas compounds are available for use with the CVD process. It is generally accepted that the configuration of the copper gas compound, at least partially, affects the ability the copper residue to adhere itself to the selected surface.

Wang, et al. in the article "Chemical Mechanical Polishing of Copper Metalized Multi-level Interconnection Devices," 1995 VMIC Conference, pg. 505, suggests the use of one particular copper gas compound, or precursor, for improving the adhesion of copper to a TiN barrier surface. Although certain precursors may improve the copper adhesion process, variations in the diffusion barrier surfaces to which the copper is applied, and variations in the copper precursors themselves, often result in the unsatisfactory adhesion of copper to a selected surface.

It has become standard practice in the industry to apply CVD copper immediately after the deposition of the diffusion barrier material to the IC. Typically, the processes are performed in a single chamber or an interconnected cluster chamber. It has generally been thought that the copper layer has the best chance of adhering to the diffusion barrier material when the diffusion barrier material surface is clean. Hence, the diffusion barrier surface is often kept in a vacuum, or controlled environment, and the copper is deposited on the diffusion barrier as quickly as possible. However, even when copper is immediately applied to the diffusion barrier surface, problems remain in keeping the copper properly adhered. A complete understanding of why copper does not always adhere directly to a diffusion barrier surface is lacking.

It would be advantageous to employ a method of improving the adhesion of CVD copper to a diffusion barrier material surface.

It would also be advantageous if a method were employed for preparing a diffusion barrier surface, in advance of CVD copper deposition, to improve the adhesion of copper of the diffusion barrier surface.

Further, it would be advantageous if the adhesion improving process did not degrade the electrical conductivity between the deposited copper and a conductive diffusion barrier material. It would also be advantageous if the process did not disrupt the silicon bonds and structures in adjoining IC substrates.

Accordingly, a method of applying copper to selected integrated circuit surfaces is provided. The selected copper-receiving surfaces are predominately on diffusion barrier material applied to selected regions of the IC. The method comprises the steps of: exposing each selected copper-receiving surface to a reactive oxygen species; oxidizing a thin layer of the diffusion barrier material surface in response to the oxygen exposure; and stopping the exposure of the diffusion barrier material to the oxygen before the oxide layer exceeds approximately 30 angstroms (Å), whereby the relatively thin oxide layer prepares the diffusion barrier material receiving surface for adhesion to copper.

In a preferred embodiment of the invention, the method includes generating the reactive oxygen species from a predominately oxygen plasma. A preferred embodiment includes generating the reactive oxygen species from an oxygen-contained plasma, with the oxygen-contained gas being selected from the group consisting of $CO$, $NO_2$, $N_2O$, and $H_2O$.

The method also provides a further step of depositing CVD copper on the oxidized diffusion barrier material surface, whereby the copper is adhered to a material which prevents the diffusion of copper into regions of the IC underlying the diffusion barrier. A preferred embodiment of the invention includes using a direct plasma source having a radio frequency (RF) power level of less than approximately 200 watts to generate the plasma, whereby the relatively low energy level of the plasma ions minimizes the disruption of silicon crystalline structures. In its preferred form, the Cu-receiving surface is exposed to reactive oxygen species at a substrate temperature of less than approximately 200° C. to protect the silicon crystalline structure of the IC.

An integrated circuit is also provided comprising a first substrate layer of diffusion barrier material having a surface. The integrated circuit further comprises a layer of oxide having a thickness of less than approximately 30 angstroms and a surface, the oxide layer overlying the first substrate surface. The integrated circuit also comprises a layer of copper overlying the oxide surface, whereby the oxide layer promotes adhesion between the copper layer and the first substrate surface.

The integrated circuit further comprises a second substrate layer having a surface underlying the diffusion barrier layer, whereby the diffusion barrier prevents migration of the copper into the second substrate layer. In a preferred embodiment of the invention the diffusion barrier material is conductive and selected from the group consisting of TiN, TiON, TiSiN, TaSiN, TaN, TiW, TiWN, Mo, and WN, whereby the copper layer is adhered to a barrier material which permits electrical communication between the copper layer and the second substrate surface.

A co-pending application Serial No. 08/717,315, filed Sep. 20, 1996, entitled "Copper Adhered to a Diffusion Barrier Surface and Method for Same", invented by Lawrence Charneski and Tue Nguyen, Docket No. SMT 243, which is assigned to the same assignees as the instant patent, discloses a method for using a variety of reactive gas species to improve copper adhesion without forming an oxide layer over the diffusion barrier.

It has been standard practice in the industry to keep a diffusion barrier surface, located on a selected surface of an IC, in a controlled environment whenever possible, and to apply the copper as quickly as possible. This practice is based on the belief that protecting the diffusion barrier from uncontrolled gas environments, and keeping the barrier clean, provide the best foundation for copper adhesion. However, as demonstrated in the present invention, a thin layer of oxide promotes chemical bonding between the copper layer and the diffusion barrier surface. An oxide thickness of approximately 30 angstroms, or less, is thick enough to promote chemical bonding, and thin enough to allow the tunneling of electrons between the copper and the diffusion barrier so that electrical conductivity is not degraded.

The above disclosed preparation of the diffusion barrier surface for a deposition of CVD copper significantly improves the adhesion of deposited copper to the diffusion barrier surface. The thin layer of oxide, formed by exposure of the diffusion barrier surface to the reactive oxygen atoms, improves the chemical bonding between the copper and diffusion barrier material. Because of the relative thinness of the oxide layer, electrical conductivity between the copper and the diffusion barrier surface is not adversely affected.

The low power levels and temperatures required to perform this process insure that minimum damage is done to the associated substrates in the integrated circuit. Since the plasma exposure process is generally completed in less than 60 seconds, a minimum of damage is done to the IC crystalline structures and a speedy, commercially viable, process is insured. The improved adhesion resulting from the oxide layer permits a greater degree of variation in the uniformity of the diffusion barrier surface and the precursor. Further, the oxidation process and the copper deposition processes can be carried out in different chambers, and at different times, because of the reduced concern over the cleanliness of the processed diffusion barrier surface.

DETAILED DESCRIPTION OF THE PREFERRED EMBODIMENT

Figure 1:
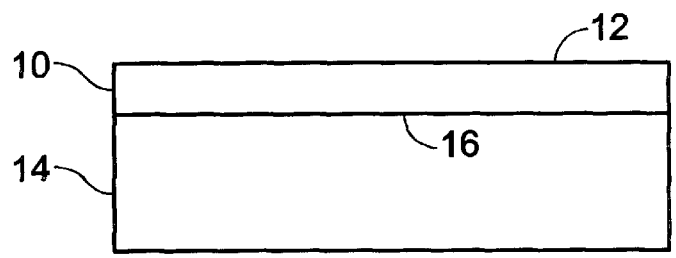
FIGS. 1 through 4 illustrate steps in the method of forming a completed integrated circuit with a diffusion barrier surface prepared for copper adhesion.

FIGS. 1 through 4 illustrate steps in the method of forming a completed integrated circuit with a diffusion barrier surface prepared for copper adhesion. FIG. 1 illustrates an integrated circuit having a first substrate layer of diffusion barrier material 10. Diffusion barrier 10 has a surface 12 for receiving copper. The IC also comprises a second substrate layer 14 having a surface 16 underlying diffusion barrier layer 10. Diffusion barrier material 10 is applied to selected areas of the IC to prevent the migration of copper into second substrate layer 14.

Figure 2:
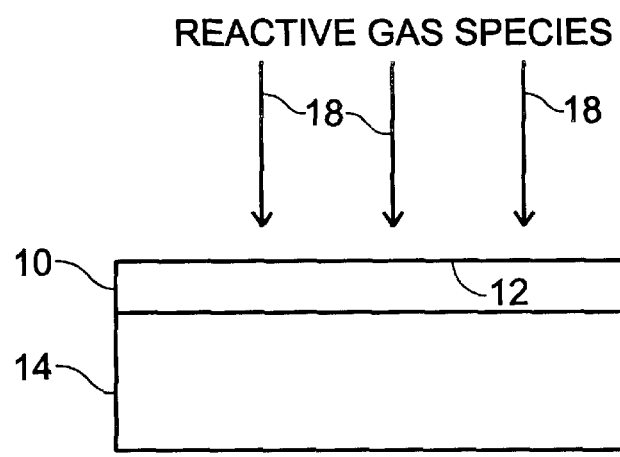

FIG. 2 is the IC of FIG. 1 with copper-receiving surface 12 being exposed to a reactive oxygen species. The oxygen exposure is represented by arrows 18. A thin layer of diffusion barrier material surface 12 is oxidized in response to oxygen exposure 18.

Figure 3:
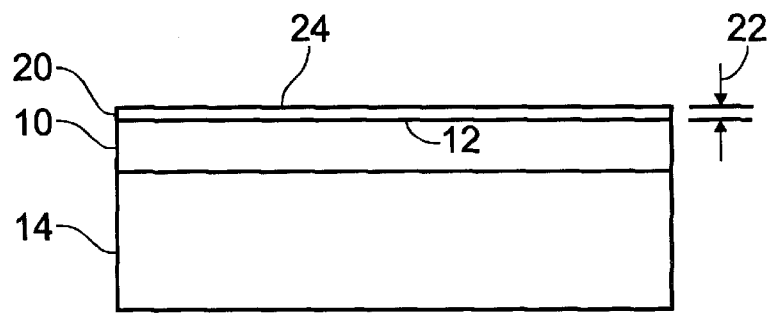

FIG. 3 is the IC of FIG. 2 with a layer of oxide 20 having a thickness 22 of less than approximately 30 angstroms and a surface 24. Oxide layer 20 overlies first substrate surface 12. The exposure of diffusion barrier material 10 to oxygen 18 is stopped before oxide layer 20 exceeds a thickness of approximately 30 angstroms.

Figure 4:
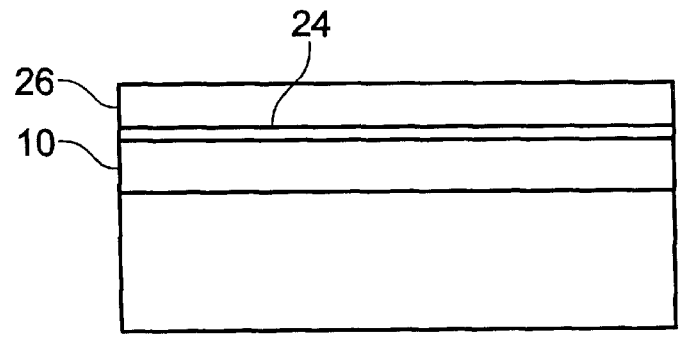

FIG. 4 is the integrated circuit of FIG. 3 with a layer of copper 26 overlying oxide surface 24. Oxide layer 24 promotes adhesion between copper layer 26 and first substrate surface 10. In a preferred form of the invention, diffusion barrier material 10 is conductive and selected from the group consisting of TiN, TiON, TiSiN, TaSiN, TaN, TiW, TiWN, Mo, and WN. When one of these materials is used as diffusion barrier material 10, copper layer 26 is adhered to a barrier material which permits electrical communication between copper layer 26 and regions of the IC underlying diffusion barrier material 10, such as second substrate surface 16.

Typically, copper layer 26 is deposited to form an electrical interface to second substrate layer 14 when substrate layer 14 is a transistor semiconductor region. Depositing copper layer 26 directly upon substrate surface 16 would allow copper to migrate into the semiconductor material, altering its intended conduction characteristics. Diffusion material 10, located between copper layer 26 and second substrate 14, prevents the diffusion of copper into semiconductor substrate 14. When diffusion material 10 is conductive, such as TiN, then electrical communication between copper layer 26 and the semiconductor second substrate layer 14 is maintained as semiconductor substrate 14 is protected from copper diffusion. In this manner, safe and effective electrical interfaces are made between copper lines and vias to silicon semiconductor material.

It is a feature of the invention that the exposure of oxide layer 20 is stopped to produce oxide layer 20 being generally in the range between 30 angstroms and 50 angstroms. When oxide layer 20 has this increased thickness, the bonding between copper layer 26 and diffusion barrier material surface 12 is promoted when electrical conductivity between copper layer 26 and diffusion barrier material surface 12 is not required. The thicker oxide layer 20 enhances adhesion with the use of certain types of diffusion barrier material 10.

In a preferred embodiment, oxide layer 20 has a thickness generally in the range of 30 angstroms to 50 angstroms overlying a nonconductive diffusion barrier material 10. That is, diffusion material 10 is also used with copper layer 26 when second substrate 14 is a nonconductive material, such as SiO, $Si_3N_6$, or BN, buffering individual semiconductor regions (not shown). Diffusion barrier 10 is used in these circumstances when there is a fear that copper will migrate through the second substrate buffer region 14 to a semiconductor region (not shown). When covering nonconductive second substrate 14, electrical conductivity through oxide layer 20 is not a concern, so that oxide thickness 22 can be thickened to promote greater adhesion.

It is also a feature of the present invention that diffusion barrier material is non-conductive and selected from the group consisting of BN, $Si_3N_4$, SiBN. When diffusion barrier material 10 is selected from one of the above mentioned materials, the copper is adhered to in electrically insulating material. Preferably, copper layer 26 is adhered to a barrier material 10 that has a low dielectric constant to minimize the capacitance between copper layer 26 and diffusion barrier 10. As is well known in the art, the use of a low dielectric material under a conductor allows for higher speed signal propagation.

Alternately, FIG. 4 may be described as an adherent copper conductor interface on an integrated circuit comprising a semiconductor layer 14, and a diffusion barrier 10 overlying semiconductor layer 14 for preventing the diffusion of copper into semiconductor layer 14. An oxide layer 20, having a thickness 22 of less than approximately 30 angstroms, overlies diffusion barrier 10. Oxide layer 20 is formed by exposing diffusion barrier 10 to a reactive oxygen species. A copper layer 26 overlies oxide layer 20, whereby oxide layer 20 is formed to prepare diffusion barrier material 10 for adhesion to copper.

Figure 5:
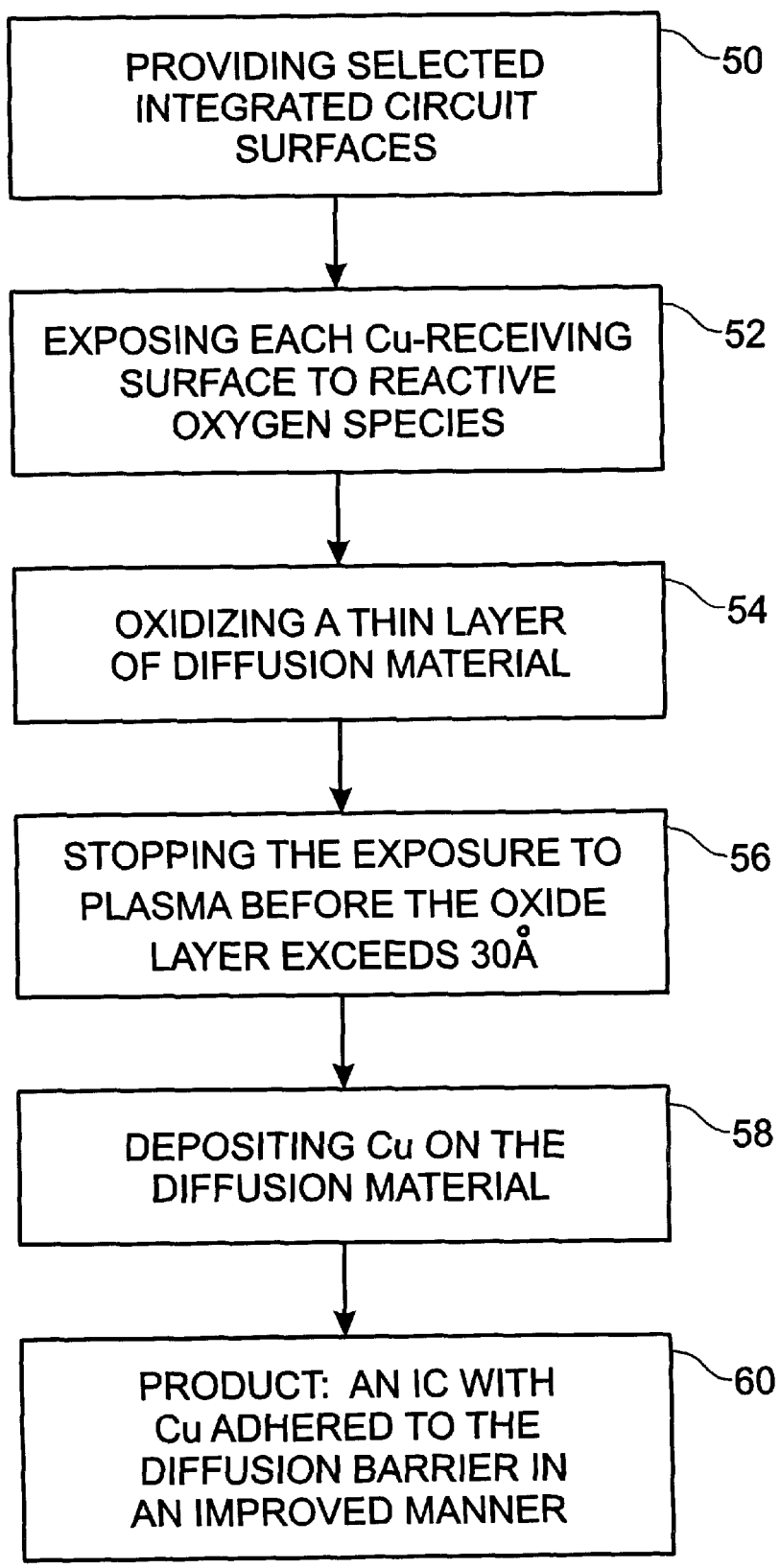
FIG. 5 is a flow chart illustrating the steps in the method of applying copper to selected copper-receiving surfaces of an integrated circuit.

FIG. 5 is a flow chart illustrating the steps in the method of applying copper to selected IC surfaces. Step 50 provides selected integrated circuit surfaces, the selected copper-receiving surfaces are predominately on diffusion barrier material applied to selected regions of the IC. Step 52 exposes each selected copper-receiving surface to a reactive oxygen species. A reactive oxygen species contains oxygen in a form that is likely to combine with other atoms. One reactive oxygen form is the single oxygen atom with its two unattached electrons. Atomic oxygen is produced as a result of molecular disassociation caused by electron impacts. Atomic oxygen readily combines with metal atoms of the diffusion barrier material at relatively low temperatures. In this manner, stable oxide compounds are formed on the diffusion barrier surface.

Step 54 oxidizes a thin layer of the diffusion barrier material surface in response to the oxygen exposure in Step 52. As mentioned above, the diffusion barrier material is typically metallic and, therefore, readily forms a metal oxide when exposed to reactive oxygen species. Alternately, oxygen compounds are formed with non-conductive diffusion barrier materials.

Step 56 stops the exposure of the diffusion barrier material to the oxygen in Step 52 before the oxide layer formed in Step 54 exceeds approximately 30 angstroms. This relatively thin oxide layer prepares the diffusion barrier material receiving surface for adhesion to copper.

It is a feature of the invention to include a further Step 58, following Step 56, of depositing CVD copper on the diffusion barrier material surface oxidized in Step 54. Unattached Copper atoms, from the CVD precursor, are able to bond to unattached oxygen atoms from the diffusion material oxide to form copper oxide. In some circumstances the oxide layer is a mixture of both copper oxide and the oxide of the diffusion material.

Step 60 is a product, an IC with copper adhered to a diffusion barrier prepared with a thin oxide layer as an improved manner of adhering copper to material which prevents the diffusion of copper into regions of the IC underlying the diffusion barrier.

It is a feature of the invention that Step 52 includes generating the reactive oxygen species from a predominately oxygen plasma so that the copper-receiving surface is exposed to a predominately oxygen plasma in Step 52. Plasma is used in many commercially prevalent forms of anisotropic etching. Ashing, or plasma etching, is performed in a chamber where an atmosphere of a relatively inert gas is introduced. The pressure of the gas and the pumping rates are controlled. A voltage across the chamber, at a predetermined frequency, is created to establish a flow of ions in a known direction. In addition, the temperature of the substrate, and the time of exposure to the ion flow, are controlled. As a consequence of the radio frequency voltage in the chamber, the relatively inert gas is transformed into a plasma consisting of unstable and, therefore, reactive ions and radicals.

In addition to generating a reactive gas species to perform a chemical process, plasma generation typically involves the physical effects of bombarding the selected IC surface with ions. These bombarding atoms have the potential of transferring their high energy to surface atoms to influence chemical reaction rates. Ion bombardment can damage chemical bonds, and damage single crystalline or polycrystalline structures. Energetic ions can also cause electron or hole trapping in gate oxide, as is well known in the art, that is only removable through annealing processes.

As a plasma etchant, the reactive gas species are typically used to remove materials, such as photoresist, from the surface of a substrate. The ions and radicals react with the film layers on the IC wafer to form volatile etch products which are then pumped away from the IC. Contrary to its popular use, plasma is used in the present invention to generate a reactive gas species which combines with the selected IC surface to add a layer of oxide over the diffusion barrier surface.

In a preferred form of the invention, Step 52 includes generating the reactive oxygen species from an oxygen-contained gas plasma. As used herein, an oxygen-contained gas refers to a compound containing oxygen atoms. It is a feature of the invention that the oxygen-contained gas is selected from the group consisting of CO, $NO_2$, $N_2O$, and $H_2O$. When these oxygen-contained gases become a plasma, oxygen atoms are released from the compound to become a reactive oxygen species.

It is a feature of the invention that selected regions of the IC include silicon, and that Step 52 includes using a direct plasma source having a RF power level of less than approximately 200 watts to generate the reactive oxygen species. The reactive oxygen species is generated from a predominately oxygen plasma. Alternately, the reactive oxygen species is generated from an oxygen-contained plasma. The relatively low energy of the plasma ions created by the RF power source minimizes the disruption of silicon crystalline structures. That is, energetic ions produced from such a low level of power are unlikely to damage adjoining silicon IC structures.

In a preferred embodiment of the invention, Step 52 is performed at a substrate temperature of less than approximately 200° C. Since the oxygen species are especially reactive, the oxidation process can be accomplished at a relatively low temperature. Low temperatures help insure that a minimum of damage and stress is done to nearby IC silicon crystalline structures or underlying IC substrates.

It is a feature of the invention that Step 56 stops the exposure of the diffusion barrier material to oxygen generally within a time interval of less than 60 seconds. Once again, because the oxygen species is so reactive, a relatively short process time protects the silicon crystalline structure of the IC.

In a preferred embodiment of the invention, Step 52 includes generating the reactive oxygen species from a downstream plasma source. In this manner, high energy ions are removed from the plasma flow to minimize damage to the IC. A downstream plasma source ionizes gas at a site relatively remote from the IC substrate. Baffles, or barriers, located between the plasma source and the IC substrate, remove the high energy ions. Reactive oxygen species resulting from the generation of plasma are typically moved to the selected IC substrate surfaces through control of the relative pressures between the plasma and IC chambers. The reactive gas species combine with the diffusion barrier surface as a purely chemical process, without energetic ions. Using a downstream plasma source allows the ions to be generated at high energy without concern that energetic ions will harm the selected IC substrate surface. Therefore, feed gases requiring a large amount of power to generate the reactive oxygen species can be used in the present invention when the oxygen species is generated from a downstream plasma source.

A thin layer of oxide located between a copper layer and a diffusion material surface improves the adhesion of the copper. Oxide bonds are formed to both the copper layer and the diffusion barrier surface. These relatively strong oxide bonds mitigate uncertainties introduced in variations between copper precursor batches. The oxide bonds also mitigate against variations in the condition and cleanliness of the diffusion barrier surface. The present invention allows the deposition of copper to be performed in a different chamber from where the diffusion barrier material is deposited. The present invention reduces the need for maintaining the diffusion barrier surface in a controlled environment. It also allows the copper deposition process to be delayed to times more convenient in the IC process.

The invention has been described above as comprising overlaying layers of copper, oxide, diffusion material, and IC substrate. The present invention is also applicable to the adhesion of copper to sidewall structures, and other copper encapsulating structures. Other variations with the scope of the present invention will occur to those skilled in the art.

What is claimed is:

1. A method of adhering Cu to selected integrated circuit (IC) surfaces, the selected Cu-receiving surfaces being predominately on diffusion barrier material applied to selected regions of the IC, the method comprising the steps of:

a) generating a reactive oxygen species from a predominately oxygen plasma and exposing each selected Cu-receiving surface to the anisotropic etching of the reactive oxygen species, whereby a plasma of reactive ions and radicals combine with the selected surface;

b) in response to the ion etch of Step a), oxidizing a thin layer of the diffusion barrier material surface in response to the oxygen exposure in step a);

c) stopping the exposure of the diffusion barrier material to the oxygen in step a) before the oxide layer formed in step b) exceeds approximately 30 Å, whereby the relatively thin oxide layer prepares the diffusion barrier material receiving surface for adhesion to Cu; and d) following step c), adhering deposited CVD Cu with the diffusion barrier material surface oxidized in step b), whereby the Cu is adhered to a material which prevents the diffusion of Cu into regions of the IC underlying the diffusion barrier.

2. A method as in claim 1 in which the diffusion material is selected from the group consisting of TiN, TiON, TiSiN, TaSiN, TaN, TiW, TiWN, Mo, and WN, whereby Cu is adhered to a barrier material which permits electrical communication between the Cu and regions of the IC underlying the diffusion barrier material.

3. A method as in claim 1 in which the diffusion barrier material is selected from the group consisting of BN, $Si_3N_4$, and SiBN, whereby Cu is adhered to an electrically insulating barrier material.

4. A method as in claim 1 in which the oxygen exposure is stopped in step c) to produce an oxide layer generally in the range between 30 Å and 50 Å, whereby a bond between the Cu layer and the diffusion material is promoted when electrical conductivity between the Cu layer and diffusion material is not required.

5. A method as in claim 1 in which step a) includes generating the reactive oxygen species from an oxygen-contained gas plasma, and in which the oxygen-contained gas is selected from the group consisting of CO, $NO_2$, $N_2O$, and $H_2O$.

6. A method as in claim 1 wherein selected regions of the IC also include silicon, and in which step a) includes using a direct plasma source having a radio frequency (RF) power level of less than approximately 200 watts to generate the reactive oxygen species, whereby the relatively low energy level of the plasma ions minimizes the disruption of silicon crystalline structures.

7. A method as in claim 1 in which step a) is performed at a substrate temperature of less than approximately 200° C. to protect the silicon crystalline structure of the IC.

8. A method as in claim 1 in which step c) includes stopping the exposure of the diffusion barrier material to oxygen generally within a time interval of less than 60 seconds, whereby the silicon crystalline structure of the IC is protected.

9. A method as in claim 1 in which step a) includes generating the reactive oxygen species from a downstream plasma source, whereby high energy ions are removed from the plasma flow to minimize damage to the IC.

10. A method of depositing CVD Cu to selected IC surfaces, the selected Cu-receiving surfaces being predominately on a TiN diffusion barrier material applied to selected regions of the IC, the method comprising the steps of:

a) using a RF power level of less than approximately 200 watts to generate a predominately oxygen plasma;

b) exposing each selected Cu-receiving surface to the anisotropic etching of a predominately oxygen plasma generated in step a), step b) being performed at a substrate temperature of less than approximately 200° C.;

c) oxidizing a thin layer of the TiN diffusion barrier material surface in response to the plasma exposure of step b);

d) stopping the exposure of the TiN diffusion barrier material surface to the plasma in step b) generally within a time interval of less than 60 seconds, before the oxide layer formed in step c) exceeds approximately 30 Å; and e) depositing CVD Cu on the TiN diffusion barrier material surface oxidized in step d), whereby the relatively thin oxide improves the bonding between the Cu and the TiN surface underlying the oxide.

* * * * *